United States Patent
Koga et al.

(10) Patent No.: US 11,118,012 B2
(45) Date of Patent: Sep. 14, 2021

(54) RESIN COMPOSITION, PREPREG, METAL-FOIL-CLAD LAMINATE, RESIN SHEET, AND PRINTED WIRING BOARD

(71) Applicant: MITSUBISHI GAS CHEMICAL COMPANY, INC., Tokyo (JP)

(72) Inventors: Shota Koga, Tokyo (JP); Kentaro Takano, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/639,936

(22) PCT Filed: Jul. 17, 2018

(86) PCT No.: PCT/JP2018/026678
§ 371 (c)(1),
(2) Date: Feb. 18, 2020

(87) PCT Pub. No.: WO2019/039135
PCT Pub. Date: Feb. 28, 2019

(65) Prior Publication Data
US 2020/0247954 A1    Aug. 6, 2020

(30) Foreign Application Priority Data

Aug. 21, 2017 (JP) .............................. JP2017-158881

(51) Int. Cl.
| | |
|---|---|
| C08G 73/10 | (2006.01) |
| C08J 5/24 | (2006.01) |
| C08L 79/08 | (2006.01) |
| H05K 1/05 | (2006.01) |

(52) U.S. Cl.
CPC .............. C08G 73/106 (2013.01); C08J 5/24 (2013.01); C08L 79/08 (2013.01); H05K 1/056 (2013.01); C08J 2379/08 (2013.01)

(58) Field of Classification Search
CPC ......... C08L 83/04; C08L 2205/02; C08J 5/24; C08J 2379/08; C08J 2383/04; C08G 73/106
See application file for complete search history.

(56) References Cited

U.S. PATENT DOCUMENTS

| | | | |
|---|---|---|---|
| 6,492,030 | B1 | 12/2002 | Hashimoto et al. |
| 8,541,532 | B2 | 9/2013 | Sugioka |
| 2010/0317774 | A1 | 12/2010 | Sugioka |
| 2013/0288063 | A1 | 10/2013 | Tsubuku et al. |
| 2013/0338363 | A1 | 12/2013 | Sugioka |
| 2018/0037720 | A1* | 2/2018 | Sugioka .................. H01L 23/29 |

FOREIGN PATENT DOCUMENTS

| | | |
|---|---|---|
| IE | 912771 | 3/1992 |
| JP | 6-504071 | 5/1994 |
| JP | 2000-204251 | 7/2000 |
| JP | 2009-292979 | 12/2009 |
| JP | 5193207 | 2/2013 |
| JP | 2014-15603 | 1/2014 |
| JP | 2016-047811 | 4/2016 |
| WO | 2012/105547 | 8/2012 |

OTHER PUBLICATIONS

International Search Report issued in International Patent Application No. PCT/JP2018/026678, dated Oct. 2, 2018.

* cited by examiner

*Primary Examiner* — Gregory Listvoyb
(74) *Attorney, Agent, or Firm* — Greenblum & Bernstein, P.L.C.

(57) ABSTRACT

The resin composition of the present invention contains a maleimide compound (A) represented by the following formula (1); and a cyanate compound (B).

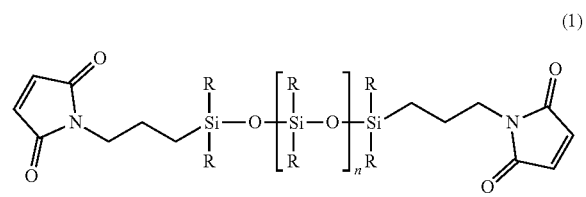

(1)

wherein R each independently represents an unsubstituted or substituted monovalent hydrocarbon group having 1 to 12 carbon atoms, a proportion of R representing a methyl group, among all R, is 50 mol % or more, and n represents an integer of 0 to 2.

10 Claims, No Drawings

RESIN COMPOSITION, PREPREG, METAL-FOIL-CLAD LAMINATE, RESIN SHEET, AND PRINTED WIRING BOARD

TECHNICAL FIELD

The present invention relates to a resin composition, a prepreg, a metal foil-clad laminate, a resin sheet and a printed wiring board.

BACKGROUND ART

In recent years, higher integration and miniaturization of semiconductors widely used in electronic equipment, communication instruments, personal computers, and the like have accelerated increasingly. With this, various characteristics required of laminates for semiconductor packages used in printed wiring boards have become increasingly strict. Examples of the required characteristics include characteristics such as flexural strength, dielectric characteristics, glass transition temperature (Tg), a thermal expansion coefficient, and thermal conductivity.

Conventionally, as resins for printed wiring boards having excellent heat resistance and electrical characteristics, cyanate compounds are known, and in recent years, resin compositions using cyanate compounds in combination with epoxy resins, bismaleimide compounds, and the like have been widely used for materials for highly functional printed wiring boards such as for semiconductor plastic packages, and the like.

For example, in Patent Literature 1, it is described that a resin composition containing a cyanate compound having a particular structure, and other components has excellent characteristics such as a low thermal expansion coefficient.

CITATION LIST

Patent Literature

Patent Literature 1: International Publication No. WO 2012/105547

SUMMARY OF INVENTION

Technical Problem

The resin composition described in Patent Literature 1 can be said to have good physical properties for characteristics such as a thermal expansion coefficient but still has room for improvement from the viewpoint of the balance of dielectric characteristics, glass transition temperature (Tg), and a thermal expansion coefficient.

The present invention has been made in view of such a problem, and an object of the present invention is to provide a resin composition, a prepreg, a metal foil-clad laminate, a resin sheet, and a printed wiring board that exhibit an excellent physical property balance in flexural strength, dielectric characteristics, glass transition temperature (Tg), a thermal expansion coefficient, and thermal conductivity.

Solution to Problem

The present inventors have diligently studied in order to solve the above problem. As a result, the present inventors have found that a resin composition comprising a maleimide compound having a particular structure, and a cyanate compound can solve the above problem, leading to completion of the present invention.

Specifically, the present invention includes the following aspects.

[1]
A resin composition comprising a maleimide compound (A) represented by the following formula (1); and a cyanate compound (B),

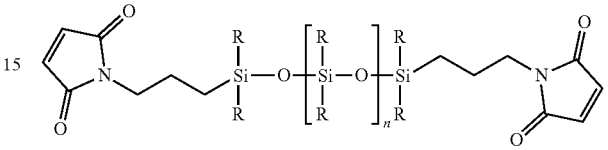

(1)

wherein R each independently represents an unsubstituted or substituted monovalent hydrocarbon group having 1 to 12 carbon atoms, a proportion of R representing a methyl group, among all R, is 50 mol % or more, and n represents an integer of 0 to 2.

[2]
The resin composition according to [1], further comprising a compound (C) other than the maleimide compound (A) and the cyanate compound (B).

[3]
The resin composition according to [2], wherein the compound (C) comprises at least one selected from a group consisting of a maleimide compound (C1) other than the maleimide compound represented by the formula (1), a nadimide compound (C2), and an oxazoline compound (C3).

[4]
The resin composition according to any one of [1] to [3], wherein a content of the maleimide compound (A) represented by the formula (1) is 1 to 99 parts by mass based on 100 parts by mass of a resin solid in the resin composition.

[5]
The resin composition according to any one of [1] to [4], further comprising a filler (D).

[6]
The resin composition according to [5], wherein a content of the filler (D) is 50 to 1600 parts by mass based on 100 parts by mass of a resin solid in the resin composition.

[7]
A prepreg comprising a base material; and the resin composition according to any one of [1] to [6] with which the base material is impregnated or coated.

[8]
A metal foil-clad laminate comprising at least one or more layers of the prepreg according to [7]; and a metal foil disposed on one surface or both surfaces of the prepreg.

[9]
A resin sheet comprising the resin composition according to any one of [1] to [6].

[10]
A printed wiring board comprising an insulating layer; and a conductor layer formed on a surface of the insulating layer, wherein the insulating layer comprises the resin composition according to any one of [1] to [6].

Advantageous Effect of Invention

According to the present invention, a resin composition, a prepreg, a metal foil-clad laminate, a resin sheet, and a printed wiring board that exhibit an excellent physical property balance in flexural strength, dielectric characteristics, heat resistance (glass transition temperature (Tg)), a thermal expansion coefficient, and thermal conductivity can be provided.

DESCRIPTION OF EMBODIMENT

A mode for carrying out the present invention (hereinafter referred to as "this embodiment") will be described in detail below, but the present invention is not limited to this, and various modifications can be made without departing from the spirit thereof.

In this embodiment, "resin solid" or "resin solid in a resin composition" refers to components in a resin composition excluding a solvent and a filler unless otherwise noted, and "100 parts by mass of a resin solid" refers to the total of components in a resin composition excluding a solvent and a filler being 100 parts by mass.

[Resin Composition]

A resin composition in this embodiment contains a maleimide compound (A) represented by the above formula (1); and a cyanate compound (B). The resin composition in this embodiment can exhibit an excellent physical property balance in flexural strength and dielectric characteristics.

[Maleimide Compound (A)]

The maleimide compound (A) in this embodiment is not particularly limited as long as it is represented by the above formula (1). The maleimide compound (A) in this embodiment contains a silicone chain having moderate flexibility, and therefore when the resin composition in this embodiment is formed into a cured product, it has characteristics excellent in flexural strength.

The maleimide compound (A) will be described below.

In the above formula (1), n represents an integer of 0 to 2. n is preferably 0 to 1, and for reasons of compatibility, n is more preferably 0. The maleimide compound (A) in this embodiment may be used as a single compound or a mixture of compounds having different n.

In the above formula (1), R each independently represents an unsubstituted or substituted monovalent hydrocarbon group having 1 to 12 carbon atoms.

The unsubstituted or substituted monovalent hydrocarbon group having 1 to 12 carbon atoms is not particularly limited. Examples thereof include alkyl groups such as a methyl group, an ethyl group, a propyl group, a butyl group, an isopropyl group, an isobutyl group, a t-butyl group, a pentyl group, a hexyl group, a heptyl group, an octyl group, and a 2-ethylhexyl group; alkenyl groups such as a vinyl group, an allyl group, a butenyl group, a pentenyl group, and a hexenyl group; aryl groups such as a phenyl group, a tolyl group, a xylyl group, a naphthyl group, and a biphenyl group; and aralkyl groups such as a benzyl group and a phenethyl group. Among these, for industrial reasons, a methyl group, an ethyl group, a phenyl group, or a benzyl group is preferred, a methyl group or a phenyl group is more preferred, and a methyl group is further preferred.

The proportion of R representing a methyl group, among all R, is 50 mol % or more, preferably 65 mol % or more, and more preferably, for industrial reasons, 70 mol % or more. The upper limit is not particularly limited but is preferably 100 mol %, that is, all are preferably methyl groups. In this embodiment, when the maleimide compound (A) is a mixture of compounds having different n, the proportion of R representing a methyl group is in the above range for all maleimide compounds contained in the mixture.

In this embodiment, the maleimide compound (A) can also be used as a powder.

One of the maleimide compound (A) can be used alone, or two or more of the maleimide compounds (A) can be appropriately mixed and used.

The maleimide compound (A) can be produced, for example, by the following method, but the production method is not particularly limited.

Examples of the production method include a method of mixing and reacting an acid anhydride-based compound and a siloxane in an organic solvent that can dissolve these raw materials. In the reaction process, a catalyst may be used as needed. In addition, the reaction is preferably performed at low temperature.

The acid anhydride-based compound is not particularly limited. Examples thereof include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride. From an industrial standpoint, maleic anhydride is preferred.

One of these acid anhydride-based compounds can be used alone, or two or more of these acid anhydride-based compounds can be appropriately mixed and used.

The siloxane is not particularly limited. Examples thereof include 1,3-bis(3-aminopropyl)tetramethyldisiloxane, bis(3-aminobutyl)tetramethyldisiloxane, bis(3-aminopropyl)tetraphenyldisiloxane, bis(3-aminobutyl)tetraphenyldisiloxane, bis(4-aminophenyl)tetramethyldisiloxane, bis(4-amino-3-methylphenyl)tetramethyldisiloxane, and bis(4-aminophenyl)tetraphenyldisiloxane. From an industrial standpoint, 1,3-bis(3-aminopropyl)tetramethyldisiloxane is preferred.

One of these siloxanes can be used alone, or two or more of these siloxanes can be appropriately mixed and used.

The organic solvent is not particularly limited. Examples thereof include aprotic polar solvents such as dimethyl sulfone, dimethyl sulfoxide, N,N-dimethylformamide, N,N-dimethylacetamide, 1,3-dimethyl-2-imidazolidinone, and N-methylpyrrolidone; sulfones such as tetramethylene sulfone; ether-based solvents such as diethylene glycol dimethyl ether, diethylene glycol diethyl ether, propylene glycol, propylene glycol monomethyl ether, propylene glycol monomethyl ether monoacetate, and propylene glycol monobutyl ether; ketone-based solvents such as methyl ethyl ketone, methyl isobutyl ketone, cyclopentanone, and cyclohexanone; and aromatic solvents such as toluene and xylene. Among these, aprotic polar solvents are preferred from the standpoint of reactivity.

One of these organic solvents can be used alone, or two or more of these organic solvents can be appropriately mixed and used.

The catalyst is not particularly limited. Examples thereof include organometallic salts such as tin octylate, zinc octylate, dibutyltin dimaleate, zinc naphthenate, cobalt naphthenate, and tin oleate; and metal chlorides such as zinc chloride, aluminum chloride, and tin chloride. Among these, cobalt naphthenate is preferred from the standpoint of reactivity.

One of these catalysts can be used alone, or two or more of these catalysts can be appropriately mixed and used.

The content of the maleimide compound (A) in the resin composition in this embodiment is not particularly limited as long as the effect of this embodiment is achieved. The content of the maleimide compound (A) is preferably 1 to 99 parts by mass, more preferably 3 to 42 parts by mass, and further preferably 5 to 30 parts by mass, based on 100 parts by mass of a resin solid in the resin composition, from the viewpoint of making superior the physical property balance of a flexural modulus and dielectric characteristics, and further, particularly preferably 10 to 20 parts by mass from the viewpoint of providing characteristics excellent in heat resistance, a thermal expansion coefficient, and thermal conductivity when forming the resin composition into a cured product.

[Cyanate Compound (B)]

The cyanate compound contained in the resin composition in this embodiment is not particularly limited as long as it is a compound containing in the molecule an aromatic moiety substituted by at least one cyanato group (cyanate group). The resin composition using the cyanate compound has characteristics excellent in heat resistance, low thermal expansion properties, and the like when formed into a cured product.

The mass average molecular weight (Mw) of the cyanate compound (B) is not particularly limited but is preferably 200 to 5000, more preferably 300 to 3000, and further preferably 400 to 2000. The cyanate compound (B) having a mass average molecular weight (Mw) in such a range tends to have superior moisture absorption heat resistance and heat resistance. In this embodiment, the mass average molecular weight is measured by gel permeation chromatography (GPC) that is a known method.

Examples of the cyanate compound are not particularly limited as long as the effect of this embodiment is achieved. Examples of the cyanate compound include one represented by the following formula (2):

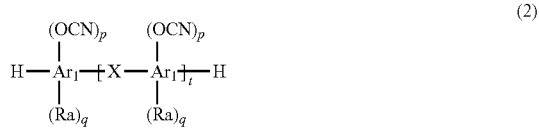

(2)

wherein $Ar_1$ represents a benzene ring, a naphthalene ring, or two benzene rings bonded to each other by a single bond. When there is a plurality of $Ar_1$, $Ar_1$ may be the same as or different from each other. Ra each independently represents a hydrogen atom, an alkyl group having 1 to 6 carbon atoms, an aryl group having 6 to 12 carbon atoms, an alkoxyl group having 1 to 4 carbon atoms, or a group in which an alkyl group having 1 to 6 carbon atoms and an aryl group having 6 to 12 carbon atoms are bonded to each other. The aromatic ring for Ra may contain a substituent, and any position can be selected for the substituents in $Ar_1$ and Ra. p represents the number of cyanato groups bonded to $Ar_1$ and is each independently an integer of 1 to 3. q represents the number of Ra bonded to $Ar_1$ and is 4-p when $Ar_1$ is a benzene ring, 6-p when $Ar_1$ is a naphthalene ring, and 8-p when $Ar_1$ is two benzene rings bonded to each other by a single bond. t represents the average number of repetitions and is in the range of 0 to 50, and the cyanate compound may be a mixture of compounds having different t. X represents any of a single bond, a divalent organic group having 1 to 50 carbon atoms (a hydrogen atom may be replaced by a heteroatom), a divalent organic group having 1 to 10 nitrogen atoms (for example, —N—R—N— (wherein R represents an organic group)), a carbonyl group (—CO—), a carboxy group (—C(=O)O—), a carbonyl dioxide group (—OC(=O)O—), a sulfonyl group (—$SO_2$—), a divalent sulfur atom, and a divalent oxygen atom, and X is each independently as defined above when there are a plurality of X.

The alkyl group for Ra in the above formula (2) may contain either of a linear or branched chain structure and a cyclic structure (for example, a cycloalkyl group).

In addition, a hydrogen atom in the alkyl group and the aryl group for Ra in formula (2) may be replaced by a halogen atom such as a fluorine atom or a chlorine atom; an alkoxyl group such as a methoxy group or a phenoxy group; a cyano group, or the like.

Specific examples of the alkyl group include, but are not particularly limited to, a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the aryl group include, but are not particularly limited to, a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group.

Examples of the alkoxyl group include, but are not particularly limited to, a methoxy group, an ethoxy group, a propoxy group, an isopropoxy group, a n-butoxy group, an isobutoxy group, and a tert-butoxy group.

Specific examples of the divalent organic group having 1 to 50 carbon atoms for X in the above formula (2) include, but are not particularly limited to, a methylene group, an ethylene group, a trimethylene group, a cyclopentylene group, a cyclohexylene group, a trimethylcyclohexylene group, a biphenylylmethylene group, a dimethylmethylenephenylene-dimethylmethylene group, a fluorenediyl group, and a phthalidediyl group. A hydrogen atom in the divalent organic group may be replaced by a halogen atom such as a fluorine atom or a chlorine atom; an alkoxyl group such as a methoxy group or a phenoxy group; a cyano group, or the like.

Examples of the divalent organic group having 1 to 10 nitrogen atoms for X in the above formula (2) include, but are not particularly limited to, an imino group and a polyimide group.

In addition, examples of the organic group of X in the above formula (2) include one having a structure represented by the following formula (3) or the following formula (4).

(3)

wherein $Ar_2$ represents a benzenetetrayl group, a naphthalenetetrayl group, or a biphenyltetrayl group, and may be the same as or different from each other when u is 2 or more; Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxy group; Rd and Re are each independently selected from any one of a hydrogen atom, an alkyl group having 1 to 6 carbon atoms, an aryl group having 6 to 12 carbon atoms, an alkoxyl group having 1 to 4 carbon atoms, or a hydroxy group; and u represents an integer of 0 to 5.

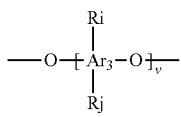

(4)

wherein Ar₃ represents a benzenetetrayl group, a naphthalenetetrayl group, or a biphenyltetrayl group, and may be the same as or different from each other when v is 2 or more; Ri and Rj each independently represent a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanato group; and v represents an integer of 0 to 5, and the cyanate compound may be a mixture of compounds having different v.

Further, examples of X in formula (2) include divalent groups represented by the following formulas:

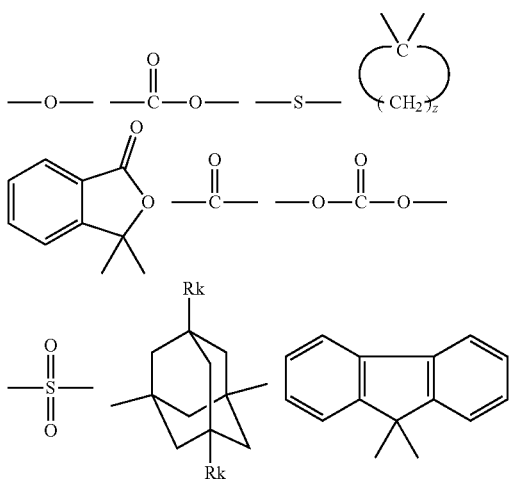

wherein z represents an integer of 4 to 7; and Rk each independently represents a hydrogen atom or an alkyl group having 1 to 6 carbon atoms; and the alkyl group having 1 to 6 carbon atoms has the same meaning as the one in the above formula (2).

Specific examples of Ar₂ in formula (3) and Ar₃ in formula (4) include a benzenetetrayl group to which two carbon atoms shown in formula (3) or two oxygen atoms shown in formula (4) are bonded at positions 1 and 4 or positions 1 and 3, a biphenyltetrayl group to which the above two carbon atoms or two oxygen atoms are bonded at positions 4 and 4', positions 2 and 4', positions 2 and 2', positions 2 and 3', positions 3 and 3', or positions 3 and 4', and a naphthalenetetrayl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in formula (3) and Ri and Rj in formula (4) have the same meanings as those in the above formula (2).

Specific examples of the cyanato-substituted aromatic compound represented by the above formula (2) include, but are not particularly limited to, cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanaphenyl)-2-phenylpropane (a cyanate of 4-a-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cyanato- or 2-cyanatonaphthalene, 1-cyanato4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl)diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis(4-cyanatophenyl) ether, bis(4-cyanatophenyl) sulfide, bis(4-cyanatophenyl) sulfone, 4-cyanatobenzoic acid-4-cyanatophenyl ester (4-cyanatophenyl-4-cyanatobenzoate), bis-(4-cyanatophenyl) carbonate, 1,3-bis(4-cyanatophenyl) adamantane, 1,3-bis(4-cyanatophenyl)-5,7-dimethyladamantane, 3,3-bis(4-cyanatophenyl)isobenzofuran-1(3H)-one (a cyanate of phenolphthalein), 3,3-bis(4-cyanato-3-methylphenyl)isobenzofuran-1(3H)-one (a cyanate of o-cresolphthalein), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene)diphthalimide, tris(3,5-dimethyl-4-cyanatobenzyl)isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl)phthalimidine, 1-methyl-3,3-bis(4-cyanatophenyl)indolin-2-one, and 2-phenyl-3,3-bis(4-cyanatophenyl)indolin-2-one.

In addition, other specific examples of the compound represented by the above formula (2) include, but are not particularly limited to, those obtained by cyanation of phenolic resins such as phenol novolac resins and cresol novolac resins (those obtained by reacting a phenol, an alkyl-substituted phenol, or a halogen-substituted phenol and a formaldehyde compound such as formalin or paraformaldehyde in an acidic solution by a known method), trisphenol novolac resins (those obtained by reacting hydroxybenzaldehyde and a phenol in the presence of an acidic catalyst), fluorene novolac resins (those obtained by reacting a fluorenone compound and a 9,9-bis(hydroxyaryl)fluorene in the presence of an acidic catalyst), phenol aralkyl resins, cresol aralkyl resins, naphthol aralkyl resins, and biphenyl aralkyl resins (those obtained by reacting a bishalogenomethyl compound as represented by $Ar_4$—$(CH_2Y)_2$ ($Ar_4$ represents a phenyl group, and Y represents a halogen atom; and the same applies below in this paragraph) and a phenol compound with an acidic catalyst or without a catalyst by a known method, those obtained by reacting a bis(alkoxymethyl) compound as represented by $Ar_4$—$(CH_2OR)_2$ and a phenol compound in the presence of an acidic catalyst by a known method, or those obtained by reacting a bis(hydroxymethyl) compound as represented by $Ar_4$—$(CH_2OH)_2$ and a phenol compound in the presence of an acidic catalyst by a known method, and those obtained by polycondensing an aromatic aldehyde compound, an aralkyl compound, and a phenol compound by a known method), phenol-modified xylene formaldehyde resins (those obtained by reacting a xylene formaldehyde resin and a phenol compound in the presence of an acidic catalyst by a known method), modified naphthalene formaldehyde resins (those obtained by reacting a naphthalene formaldehyde resin and a hydroxy-substituted aromatic compound in the presence of an acidic catalyst by a known method), and phenol-modified dicyclopentadiene resins, and phenolic resins containing a polynaphthylene ether structure (those obtained by subjecting a polyvalent hydroxynaphthalene compound having two or more phenolic hydroxy groups in one molecule to dehydration condensation in the presence of a basic catalyst by a known method), and prepolymers thereof.

One of the cyanate compound can be used alone, or two or more of the cyanate compounds (B) can be appropriately mixed and used.

Among cyanate compounds, bisphenol-based cyanate compounds such as bisphenol A-based cyanate compounds, bisphenol E-based cyanate compounds, and bisphenol F-based cyanate compounds, naphthol aralkyl-based cyanate compounds, and phenol novolac-based cyanate compounds are preferred. In other words, in this embodiment, the cyanate compound preferably contains at least one selected from the group consisting of a bisphenol-based cyanate compound, a naphthol aralkyl-based cyanate compound, and a phenol novolac-based cyanate compound. Further, the cyanate compound more preferably contains a naphthol aralkyl-based cyanate compound. As the naphthol aralkyl-based cyanate, a naphthol aralkyl-based cyanate represented by the following formula (5) is further preferred.

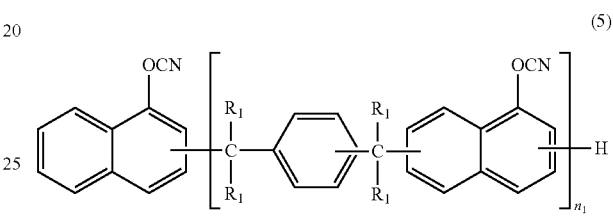

(5)

wherein $R_1$ each independently represents a hydrogen atom or a methyl group, and of these, a hydrogen atom is preferred; $n_1$ represents an integer of 1 or more; and the upper limit value of $n_1$ is usually 10, preferably 6.

In addition, the mass average molecular weight (Mw) of the naphthol aralkyl-based cyanate is not particularly limited but is preferably 200 to 5000, more preferably 300 to 3000, and further preferably 400 to 2000. The naphthol aralkyl-based cyanate having a mass average molecular weight (Mw) in such a range tends to have superior moisture absorption heat resistance and heat resistance.

The content of the cyanate compound can be appropriately set according to the desired characteristics and is not particularly limited but is preferably 1 to 99 parts by mass, more preferably 10 to 80 parts by mass, and further preferably 25 to 70 parts by mass, based on 100 parts by mass of the resin solid in the resin composition, from the viewpoint of more improving the physical property balance of flexural strength, dielectric characteristics, heat resistance, a thermal expansion coefficient, and thermal conductivity, and still more preferably 40 to 60 parts by mass from the viewpoint of providing characteristics excellent in heat resistance, a thermal expansion coefficient, and thermal conductivity when forming the resin composition into a cured product.

[Compound (C)]

The resin composition in this embodiment preferably contains a compound (C) other than the above maleimide compound (A) and cyanate compound (B). The compound (C) is not particularly limited but more preferably contains at least one selected from the group consisting of a maleimide compound other than the maleimide compound represented by the above formula (1), a nadimide compound, and an oxazoline compound, from the viewpoint of obtaining a cured product having characteristics superior in heat resistance, a thermal expansion coefficient, and thermal conductivity.

One of these compounds (C) can be used alone, or two or more of these compounds (C) can be appropriately mixed and used.

The content of the compound (C) is not particularly limited but is preferably 15 to 50 parts by mass, more preferably 17 to 48 parts by mass, and further preferably 25 to 45 parts by mass, based on 100 parts by mass of the resin solid in the resin composition, and further, particularly preferably 30 to 40 parts by mass from the viewpoint of providing characteristics excellent in heat resistance, a thermal expansion coefficient, and thermal conductivity when forming the resin composition into a cured product.

(Maleimide Compound (C1) Other Than Maleimide Compound Represented by Above Formula (1))

The maleimide compound (C1) other than the maleimide compound represented by the above formula (1) is not particularly limited as long as it is a maleimide compound other than the maleimide compound represented by formula (1). Examples of the maleimide compound (C1) include N-phenylmaleimide, N-hydroxyphenylmaleimide, bis(4-maleimidophenyl)methane, 2,2-bis{4-(4-maleimidophenoxy)-phenyl}propane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, o-phenylenebiscitraconimide, m-phenylenebiscitraconimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethanemaleimide, novolac-based maleimide compounds, biphenyl aralkyl-based maleimide compounds, a maleimide compound represented by the following formula (6), a maleimide compound represented by the following formula (7), and prepolymers of these maleimide compounds, and prepolymers of maleimide compounds and amine compounds.

One of these maleimide compounds (C1) can be used alone, or two or more of these maleimide compounds (C1) can be appropriately mixed and used.

Among these, the maleimide compound represented by the following formula (6) and the maleimide compound represented by the following formula (7) are preferred because the heat resistance and the thermal conductivity improve more, and the maleimide compound represented by the following formula (6) is more preferred because the heat resistance and the thermal conductivity improve more.

The reason why the heat resistance and the thermal conductivity improve more is not certain, but the present inventors presume as follows. The maleimide compounds represented by the following formulas (6) and (7) have a moderately flexible main chain, and therefore by using them in combination with the maleimide compound (A), the restraining force received from the crosslinking points weakens in cooling and expansion and contraction, and when the resin composition is formed into a cured product, it can have an optimal structure, and the free volume decreases. Therefore, the cured products using the maleimide compounds represented by the following formulas (6) and (7) have improved crosslinking density and have a three-dimensional crosslinked structure and therefore have improved glass transition temperature and have superior heat resistance. Further, it is presumed that the number of crosslinking points increases in the structure, and thus the thermal conductivity also improves. In addition, low elasticity provides a board warpage reduction effect due to stress relaxation during thermal curing.

As the maleimide compound represented by the following formula (6), commercial products can also be used. Examples thereof include BMI-2300 (manufactured by Daiwakasei Industry Co., LTD.). As the maleimide compound represented by the following formula (7), commercial products can also be used. Examples thereof include MIR-3000 (manufactured by Nippon Kayaku Co., Ltd.).

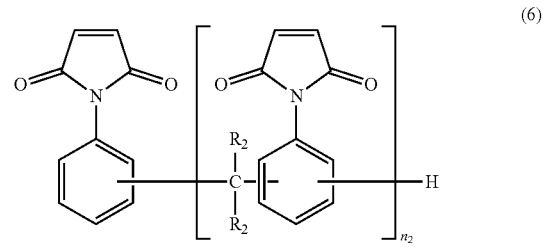

(6)

wherein $R_2$ each independently represents a hydrogen atom or a methyl group and preferably represents a hydrogen atom. In addition, in formula (6), $n_2$ represents an integer of 1 or more and is preferably an integer of 10 or less, more preferably an integer of 7 or less, and further preferably an integer of 5 or less.

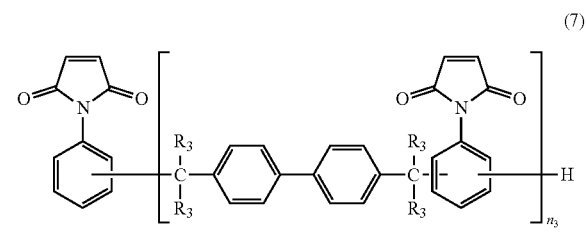

(7)

wherein the plurality of $R_3$ each independently represent a hydrogen atom or a methyl group. $n_3$ represents an integer of 1 or more and preferably represents an integer of 1 to 5.

When the content of the maleimide compound (C1) is within the range of the content of the above compound (C), the thermal expansion coefficient of the obtained cured product tends to decrease more, and the heat resistance tends to improve more.

(Nadimide Compound (C2))

The nadimide compound (C2) is not particularly limited as long as it is a compound having one or more nadimide groups in the molecule. Examples of the nadimide compound (C2) include alkenyl-substituted nadimides. One of these nadimide compounds (C2) can be used alone, or two or more of these nadimide compounds (C2) can be appropriately mixed and used.

The alkenyl-substituted nadimides are not particularly limited as long as they are compounds having one or more alkenyl-substituted nadimide groups in the molecule. Specific examples thereof include a compound represented by the following general formula (8):

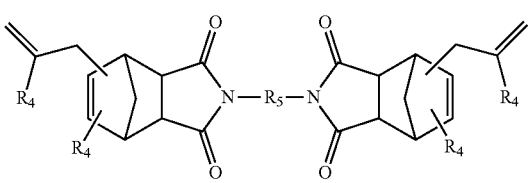

(8)

wherein $R_4$ each independently represents a hydrogen atom or an alkyl group having 1 to 6 carbon atoms, and $R_5$ represents an alkylene group having 1 to 6 carbon atoms, a phenylene group, a biphenylene group, a naphthylene group, or a group represented by the following general formula (9) or (10).

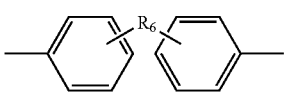

(9)

wherein $R_6$ represents a methylene group, an isopropylidene group, or a substituent represented by CO, O, S, or $SO_2$.

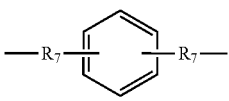

(10)

wherein $R_7$ each independently represents a selected alkylene group having 1 to 4 carbon atoms or cycloalkylene group having 5 to 8 carbon atoms.

In addition, for the alkenyl-substituted nadimide represented by formula (8), commercial ones can also be used. The commercially available ones are not particularly limited. Examples thereof include a compound represented by the following formula (11) (BANI-M (manufactured by Maruzen Petrochemical Co., Ltd.)) and a compound represented by the following formula (12) (BANI-X (manufactured by Maruzen Petrochemical Co., Ltd.)).

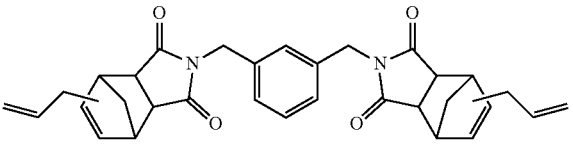

(12)

(Oxazoline Compound (C3))

The oxazoline compound is not particularly limited as long as it is a compound having one or more oxazoline groups in the molecule. One of the oxazoline compound (C3) can be used alone, or two or more of the oxazoline compounds (C3) can be appropriately mixed and used.

Specific examples of the oxazoline compound include vinyloxazolines such as 2-vinyl-2-oxazoline, 5-methyl-2-vinyl-2-oxazoline, 4,4-dimethyl-2-vinyl-2-oxazoline, 4,4-dimethyl-2-vinyl-5,5-dihydro-4H-1,3-oxazine, 4,4,6-trimethyl-2-vinyl-5,6-dihydro-4H-1,3-oxazine, 2-isopropenyl-2-oxazoline, styrene-2-isopropenyl-2-oxazoline, and 4,4-dimethyl-2-isopropenyl-2-oxazoline; and bisoxazoline compounds such as 1,3-phenylenebis(2-oxazoline), 1,4-phenylenebis(2-oxazoline), 2,2-bis(2-oxazoline), 2,2-bis(4-methyl-2-oxazoline), 2,2-bis(4,4-dimethyl-2-oxazoline), 2,2-bis(4-ethyl-2-oxazoline), 2,2-bis(4,4-diethyl-2-oxazoline), 2,2-bis(4-propyl-2-oxazoline), 2,2-bis(4-butyl-2-oxazoline), 2,2-bis(4-hexyl-2-oxazoline), 2,2-bis(4-phenyl-2-oxazoline), 2,2-bis(4-cyclohexyl-2-oxazoline), 2,2-bis(4-benzyl-2-oxazoline), 2,2-ethylenebis(2-oxazoline), 2,2-tetramethylenebis(2-oxazoline), 2,2-hexamethylenebis(2-oxazoline), 2,2-octamethylenebis(2-oxazoline), 2,2-ethylenebis(4-ethyl-2-oxazoline), 2,2-tetraethylenebis(4-ethyl-2-oxazoline), and 2,2-cyclohexylenebis(4-ethyl-2-oxazoline).

[Filler (D)]

The resin composition in this embodiment preferably further contains a filler (D) in order to improve various characteristics such as heat resistance, thermal expansion characteristics, dimensional stability, thermal conductivity, and dielectric characteristics. The filler (D) is not particularly limited. Examples thereof include inorganic fillers and organic fillers. One of these fillers (D) can be used alone, or two or more of these fillers (D) can be appropriately mixed and used.

The filler used in this embodiment is not particularly limited as long as it has insulating properties. Examples of the filler include silica (for example, slurry silica, natural silica, fused silica, amorphous silica, and hollow silica), aluminum compounds (for example, boehmite, aluminum hydroxide, and alumina), magnesium compounds (for example, magnesium oxide and magnesium hydroxide), calcium compounds (for example, calcium carbonate),

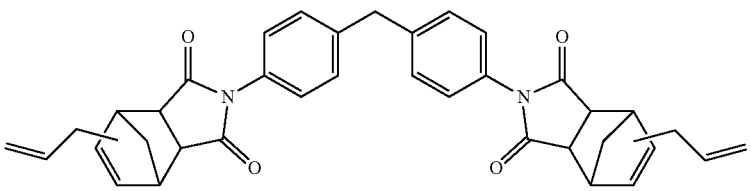

(11)

molybdenum compounds (for example, molybdenum oxide and zinc molybdate), barium compounds (for example, barium sulfate and barium silicate), talc (for example, natural talc and calcined talc), mica (isinglass), glass (for example, short fibrous glass, spherical glass, and fine powder glass (for example, E glass, T glass, and D glass)), silicone powders, fluororesin-based fillers, urethane resin-based fillers, acrylic resin-based fillers, polyethylene-based fillers, styrene-butadiene rubbers, and silicone rubbers.

Among these, silica, aluminum hydroxide, boehmite, magnesium oxide, and magnesium hydroxide are preferred, and from the viewpoint of improving the heat resistance of the cured product and obtaining a low thermal expansion coefficient, slurry silica is more preferred. Specific examples of the silica include SFP-130MC manufactured by Denka Company Limited, and SC2050-MB, SC1050-MLE, YA010C-MFN, and YA050C-MJA manufactured by Admatechs Company Limited.

These fillers (D) may be surface-treated with the following silane coupling agent and the like.

In the resin composition in this embodiment, the content of the filler (D) is preferably 50 to 1600 parts by mass, more preferably 60 to 1200 parts by mass, further preferably 70 to 1000 parts by mass, and particularly preferably 80 to 800 parts by mass, based on 100 parts by mass of the resin solid in the resin composition. When the content of the filler (D) is within the above range, the thermal expansion coefficient of the obtained cured product tends to decrease further.

<Silane Coupling Agent and Wetting and Dispersing Agent>

In the resin composition in this embodiment, a silane coupling agent and/or a wetting and dispersing agent can also be used in combination in order to improve the dispersibility of the filler, and the adhesive strength between the polymers and/or the resins and the filler.

The silane coupling agents are not particularly limited as long as they are silane coupling agents generally used for surface treatment of inorganic matter. Examples of the silane coupling agent include aminosilane-based silane coupling agents such as γ-aminopropyltriethoxysilane and N-β-(aminoethyl)-γ-aminopropyltrimethoxysilane; epoxysilane-based silane coupling agents such as γ-glycidoxypropyltrimethoxysilane; acrylic silane-based silane coupling agents such as γ-acryloxypropyltrimethoxysilane; cationic silane-based silane coupling agents such as N-β-(N-vinylbenzylaminoethyl)-γ-aminopropyltrimethoxysilane hydrochloride; and phenylsilane-based silane coupling agents. One of these silane coupling agents can be used alone, or two or more of these silane coupling agents can be appropriately mixed and used.

The wetting and dispersing agent is not particularly limited as long as it is a dispersion stabilizer used for a paint. Examples of the wetting and dispersing agent include wetting and dispersing agents such as DISPERBYK (registered trademark)-110, 111, 118, 180, and 161 and BYK (registered trademark)-W996, W9010, and W903 manufactured by BYK Japan KK. One of these wetting and dispersing agents can be used alone, or two or more of these wetting and dispersing agents can be appropriately mixed and used.

The resin composition in this embodiment can further contain one or more selected from the group consisting of an epoxy resin, a phenolic resin, an oxetane resin, and a compound having a polymerizable unsaturated group. These components will be described below.

(Epoxy Resin)

As the epoxy resin, known ones can be appropriately used as long as they are epoxy resins having two or more epoxy groups in one molecule. The type of the epoxy resin is not particularly limited.

Examples of the epoxy resin include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, aralkyl novolac-based epoxy resins, biphenyl aralkyl-based epoxy resins, naphthylene ether-based epoxy resins, cresol novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins, glycidyl amines, glycidyl esters, compounds obtained by epoxidizing double bonds of butadiene and the like, and compounds obtained by reaction of hydroxyl group-containing silicone resins and epichlorohydrin. Among these epoxy resins, biphenyl aralkyl-based epoxy resins, naphthylene ether-based epoxy resins, polyfunctional phenol-based epoxy resins, and naphthalene-based epoxy resins are preferred in terms of flame retardancy and heat resistance.

One of these epoxy resins can be used alone, or two or more of these epoxy resins can be appropriately mixed and used.

(Phenolic Resin)

As the phenolic resin, those generally known can be used as long as they are phenolic resins having two or more hydroxyl groups in one molecule. The phenolic resin is not particularly limited.

Examples of the phenol resin include bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenyl aralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenol aralkyl-based phenolic resins, naphthol aralkyl-based phenolic resins, dicyclopentadiene-based phenolic resins, biphenyl-based phenolic resins, alicyclic phenolic resins, polyol-based phenolic resins, phosphorus-containing phenolic resins, and hydroxyl group-containing silicone resins. Among these phenolic resins, biphenyl aralkyl-based phenolic resins, naphthol aralkyl-based phenolic resins, phosphorus-containing phenolic resins, and hydroxyl group-containing silicone resins are preferred in terms of flame retardancy.

One of these phenolic resins can be used alone, or two or more of these phenolic resins can be appropriately mixed and used.

(Oxetane Resin)

As the oxetane resin, those generally known can be used, and the oxetane resin is not particularly limited.

Examples of the oxetane resin include oxetane, alkyloxetanes such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoxetane, 2-chloromethyloxetane, 3,3-bis(chloromethyl)oxetane, biphenyl-based oxetane, OXT-101 (trade name manufactured by Toagosei Co., Ltd.), and OXT-121 (trade name manufactured by Toagosei Co., Ltd.). One of these oxetane resins can be used alone, or two or more of these oxetane resins can be appropriately mixed and used.

(Compound Having Polymerizable Unsaturated Group)

As the compound having a polymerizable unsaturated group, those generally known can be used, and the compound having a polymerizable unsaturated group is not particularly limited. Examples of the compound having a polymerizable unsaturated group include vinyl compounds such as ethylene, propylene, styrene, divinylbenzene, and divinylbiphenyl; (meth)acrylates of monohydric or polyhydric alcohols such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate; epoxy (meth)acrylates such as bisphenol A-based epoxy (meth)acrylate and bisphenol F-based epoxy (meth) acrylate; and benzocyclobutene resins.

One of these compounds having an unsaturated group can be used alone, or two or more of these compounds having an unsaturated group can be appropriately mixed and used. The above "(meth)acrylate" is a concept including acrylate and methacrylate corresponding to the acrylate.

(Curing Accelerator)

The resin composition in this embodiment may further contain a curing accelerator. The curing accelerator is not particularly limited. Examples thereof include imidazoles such as triphenylimidazole; organic peroxides such as benzoyl peroxide, lauroyl peroxide, acetyl peroxide, parachlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, N,N-dimethylpyridine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organometallic salts such as lead naphthenate, lead stearate, zinc naphthenate, zinc octylate, tin oleate, dibutyltin maleate, manganese naphthenate, cobalt naphthenate, and acetylacetone iron; products obtained by dissolving these organometallic salts in hydroxyl group-containing compounds such as phenols and bisphenols; inorganic metal salts such as tin chloride, zinc chloride, and aluminum chloride; and organotin compounds such as dioctyltin oxide and other alkyltins and alkyltin oxides. Among these, triphenylimidazole is particularly preferred because it accelerates a curing reaction, and the glass transition temperature (Tg) and the thermal expansion coefficient tend to be excellent.

One of these curing accelerators can be used alone, or two or more of these curing accelerators can be appropriately mixed and used.

(Other Additives)

Various polymer compounds such as another thermosetting resin, a thermoplastic resin and an oligomer thereof, and an elastomer, a flame-retardant compound, various additives, and the like can be used in combination in the resin composition in this embodiment in a range in which the expected characteristics are not impaired. These are not particularly limited as long as they are those generally used.

Specific examples of the flame-retardant compound include, but not particularly limited to, bromine compounds such as 4,4'-dibromobiphenyl; phosphates, melamine phosphate, phosphorus-containing epoxy resins, nitrogen compounds such as melamine and benzoguanamine; oxazine ring-containing compounds, and silicone-based compounds.

Examples of the various additives include, but not particularly limited to, for example, ultraviolet absorbing agents, antioxidants, photopolymerization initiators, fluorescent brightening agents, photosensitizers, dyes, pigments, thickening agents, flow-adjusting agents, lubricants, defoaming agents, dispersing agents, leveling agents, brightening agents, and polymerization inhibitors.

One of these additives can be used alone, or two or more of these additives can be appropriately mixed and used.

(Organic Solvent)

The resin composition in this embodiment can contain an organic solvent as needed. In this case, the resin composition in this embodiment can be used as a form (solution or varnish) in which at least some, preferably all, of the above-described various resin components are dissolved in or compatible with the organic solvent.

As the organic solvent, known ones can be appropriately used as long as they can dissolve or be compatible with at least some, preferably all, of the above-described various resin components. The type of the organic solvent is not particularly limited. Specific examples of the organic solvent include ketones such as acetone, methyl ethyl ketone, and methyl isobutyl ketone; cellosolve-based solvents such as propylene glycol monomethyl ether and propylene glycol monomethyl ether acetate; ester-based solvents such as methyl lactate, methyl acetate, ethyl acetate, butyl acetate, isoamyl acetate, ethyl lactate, methyl methoxypropionate, and methyl hydroxyisobutyrate; polar solvents such as amides such as dimethylacetamide and dimethylformamide; and nonpolar solvents such as aromatic hydrocarbons such as toluene and xylene.

One of these organic solvents can be used alone, or two or more of these organic solvents can be appropriately mixed and used.

[Method for Producing Resin Composition]

The resin composition in this embodiment can be prepared according to an ordinary method, and the method for preparing the resin composition in this embodiment is not particularly limited as long as it is a method in which a resin composition uniformly containing the maleimide compound (A) represented by the above formula (1), the cyanate compound (B), and the above-described other components is obtained. For example, the resin composition in this embodiment can be easily prepared by sequentially blending the maleimide compound (A) represented by the above formula (1), the cyanate compound (B), and the above-described other components with a solvent and sufficiently stirring the blend.

During preparation of the resin composition, known treatment (stirring, mixing, and kneading treatment and the like) for uniformly dissolving or dispersing the components can be performed. For example, in uniform dispersion of the filler (D), by performing stirring and dispersion treatment using a stirring vessel provided with a stirrer having suitable stirring ability, the dispersibility in the resin composition is increased. The above stirring, mixing, and kneading treatment can be appropriately performed, for example, using a known apparatus such as an apparatus intended for mixing such as a ball mill or a bead mill, or a revolution-rotation mixing apparatus.

The resin composition in this embodiment can be used as constituent materials of a prepreg, a metal foil-clad laminate, a printed wiring board, and a semiconductor package. For example, a prepreg can be obtained by impregnating or coating a base material with a solution of the resin composition in this embodiment dissolved in a solvent and drying the solution.

In addition, a buildup film or a dry film solder resist can be obtained by using a peelable plastic film as a base material, coating the plastic film with a solution of the resin composition in this embodiment dissolved in a solvent, and drying the solution. Here, the solvent can be dried by drying at a temperature of 20 to 150° C. for 1 to 90 minutes.

In addition, the resin composition in this embodiment can also be used in an uncured state in which the solvent is only dried, or in a semi-cured (B-staged) state as needed.

[Prepreg]

A prepreg in this embodiment will be described in detail.

The prepreg in this embodiment contains a base material; and the above resin composition with which the base material is impregnated or coated. The method for producing the prepreg in this embodiment is not particularly limited as long as it is a method of combining the resin composition in this embodiment and a base material to produce a prepreg. Specifically, the prepreg in this embodiment can be produced by impregnating or coating a base material with the resin composition in this embodiment and then semi-curing the resin composition by a method of drying in a dryer at 120 to 220° C. for about 2 to 15 minutes, or the like. At this time, the amount of the resin composition adhered to the base material, that is, the content of the resin composition (including the filler (D)) based on the total amount of the prepreg after the semi-curing, is preferably in the range of 20 to 99% by mass.

The base material used when the prepreg in this embodiment is produced is not particularly limited, and known ones used for various printed wiring board materials can be used. Examples of the base material include woven fabrics of fibers of glass such as E glass, D glass, L glass, S glass, T glass, Q glass, UN glass, NE glass, and spherical glass; inorganic fibers of materials other than glass, such as quartz; organic fibers of polyimides, polyamides, polyesters, and the like; liquid crystal polyesters, and the like. As the shape of the base material, woven fabrics, nonwoven fabrics, rovings, chopped strand mats, surfacing mats, and the like are known, and the shape of the base material may be any of these. One of these base materials can be used alone, or two or more of these base materials can be appropriately mixed and used. Among woven fabrics, particularly, woven fabrics subjected to ultra-opening treatment or clogging treatment are preferred from the viewpoint of dimensional stability. Further, glass woven fabrics surface-treated with silane coupling agents for epoxysilane treatment, aminosilane treatment, or the like are preferred from the viewpoint of moisture absorption heat resistance. In addition, liquid crystal polyester woven fabrics are preferred in terms of electrical characteristics. Further, the thickness of the base material is not particularly limited, but is preferably in the range of 0.01 to 0.2 mm in laminate applications.

[Metal Foil-Clad Laminate]

A metal foil-clad laminate in this embodiment contains at least one or more layers of the above-described prepreg; and metal foil disposed on one surface or both surfaces of the prepreg. Specifically, the metal foil-clad laminate in this embodiment can be fabricated by disposing foil of a metal such as copper or aluminum on one surface or both surfaces of one of the above-described prepreg or a stack of a plurality of the prepregs and laminate-molding the metal foil and the prepreg or the stack. The metal foil used here is not particularly limited as long as it is one used for a printed wiring board material. Copper foil such as rolled copper foil and electrolytic copper foil is preferred. In addition, the thickness of the metal foil is not particularly limited but is preferably 2 to 70 μm, more preferably 3 to 35 μm. As the molding conditions, methods used when usual laminates and multilayer boards for printed wiring boards are fabricated can be adopted. For example, the metal foil-clad laminate in this embodiment can be produced by laminate-molding under the conditions of a temperature of 180 to 350° C., a heating time of 100 to 300 minutes, and a surface pressure of 20 to 100 kg/cm$^2$ using a multistage press, a multistage vacuum press, a continuous molding machine, an autoclave molding machine, or the like. In addition, a multilayer board can also be fabricated by laminate-molding the above prepreg and a separately fabricated wiring board for an inner layer in combination. As the method for producing a multilayer board, for example, 35 μm copper foil is disposed on both surfaces of one of the above-described prepreg, the copper foil and the prepreg are laminated and formed under the above conditions, then inner layer circuits are formed, and these circuits are subjected to blackening treatment to form an inner layer circuit board. Further, these inner layer circuit boards and the above prepregs are alternately disposed one by one, copper foil is further disposed on the outermost layers, and the copper foil, the inner layer circuit boards, and the prepregs are laminate-molded under the above conditions preferably under vacuum. Thus, a multilayer board can be fabricated.

[Printed Wiring Board]

The metal foil-clad laminate in this embodiment can be preferably used as a printed wiring board by further forming a pattern. The printed wiring board can be produced according to an ordinary method, and the method for producing the printed wiring board is not particularly limited. One example of a method for producing a printed wiring board will be shown below.

First, the above-described metal foil-clad laminate is provided. Next, the surfaces of the metal foil-clad laminate are subjected to etching treatment to form inner layer circuits to fabricate an inner layer board. The inner layer circuit surfaces of this inner layer board are subjected to surface treatment for increasing adhesive strength, as needed, and then the required number of the above-described prepregs are stacked on the inner layer circuit surfaces. Further, metal foil for outer layer circuits is laminated on the outside of the stack, and heat and pressure are applied for integral molding. In this manner, a multilayer laminate in which insulating layers containing a base material and a cured product of a resin composition are formed between inner layer circuits and metal foil for outer layer circuits is produced. Then, this multilayer laminate is subjected to perforation for through holes and via holes, and then plating metal films that allow conduction between the inner layer circuits and the metal foil for outer layer circuits are formed on the wall surfaces of these holes. Further, the metal foil for outer layer circuits is subjected to etching treatment to form outer layer circuits. Thus, a printed wiring board is produced.

The printed wiring board obtained in the above production example contains a configuration in which it has insulating layers and conductor layers formed on surfaces of these insulating layers, and the insulating layers contain the resin composition in this embodiment described above. In other words, the prepreg in this embodiment described above (the base material and the resin composition in this embodiment with which the base material is impregnated or coated) and the resin composition layer of the metal foil-clad laminate in this embodiment described above (the layer containing the resin composition in this embodiment) are composed of an insulating layer containing the resin composition in this embodiment.

[Resin Sheet]

A resin sheet in this embodiment refers to a support and the above layer containing the resin composition disposed on a surface of the support (laminated sheet) and also refers to only the resin composition layer obtained by removing the support (single-layer sheet). In other words, the resin sheet in this embodiment contains at least the resin composition in this embodiment. This laminated sheet can be obtained by coating a support with a solution of the above resin composition dissolved in a solvent and drying the solution. The support used here is not particularly limited. Examples thereof include organic film supports such as polyethylene films, polypropylene films, polycarbonate films, polyethylene terephthalate films, ethylene-tetrafluoroethylene copolymer films, and release films obtained by coating surfaces of these films with release agents, and polyimide films; conductor foil such as copper foil and aluminum foil, and plate-shaped inorganic films such as glass plates, SUS plates, and FRP. Examples of the method include a method of fabricating a laminated sheet in which a support and a resin composition layer are integrated, by coating a support with a solution of the above resin composition dissolved in a solvent by a bar coater, a die coater, a doctor blade, a baker applicator, or the like. In addition, a single-layer sheet can also be obtained by peeling or etching the support from the resin sheet obtained by further drying after the coating. A single-layer sheet can also be obtained without using a support by supplying a solution of the above resin composition in this embodiment dissolved in or made compatible with a solvent into a mold having a sheet-shaped cavity, and drying the solution, or the like for molding into a sheet shape.

In fabrication of the resin sheet or the single-layer sheet in this embodiment, the drying conditions when the solvent is removed are not particularly limited, but drying is preferably performed at a temperature of 20 to 200° C. for 1 to 90 minutes. At 20° C. or more, remaining of the solvent in the resin composition can be more prevented, and at 200° C. or less, progress of curing of the resin composition can be suppressed. In addition, the thickness of the resin layer in the resin sheet or the single-layer sheet in this embodiment can be adjusted by the concentration and coating thickness of the solution of the resin composition in this embodiment and is not particularly limited. However, the thickness is preferably 0.1 to 500 μm. When the thickness of the resin layer is 500 μm or less, the solvent is even less likely to remain during drying.

The resin sheet in this embodiment can be used as an interlayer insulating layer of the above printed wiring board.

EXAMPLES

This embodiment will be more specifically described below using an Example and a Comparative Example. This embodiment is not limited in any way by the following Example.

[Synthesis Example 1] Synthesis of Naphthol Aralkyl-Based Cyanate Resin (SNCN)

300 g (1.28 mol in terms of OH groups) of a 1-naphthol aralkyl resin (manufactured by NIPPON STEEL & SUMIKIN CHEMICAL CO., LTD.) and 194.6 g (1.92 mol) (1.5 mol based on 1 mol of hydroxy groups) of triethylamine were dissolved in 1800 g of dichloromethane, and this solution was a solution 1.

While 125.9 g (2.05 mol) (1.6 mol based on 1 mol of hydroxy groups) of cyanogen chloride, 293.8 g of dichloromethane, 194.5 g (1.92 mol) (1.5 mol based on 1 mol of hydroxy groups) of 36% hydrochloric acid, and 1205.9 g of water were kept at a liquid temperature of −2 to −0.5° C. under stirring, the solution 1 was poured over 30 minutes. After completion of pouring of the solution 1, the mixture was stirred at the same temperature for 30 minutes, and then a solution of 65 g (0.64 mol) (0.5 mol based on 1 mol of hydroxy groups) of triethylamine dissolved in 65 g of dichloromethane (solution 2) was poured over 10 minutes. After completion of pouring of the solution 2, the mixture was stirred at the same temperature for 30 minutes to complete the reaction.

Then, the reaction liquid was allowed to stand to separate the organic phase and the aqueous phase. The obtained organic phase was washed five times with 1300 g of water. The electrical conductivity of the wastewater from the fifth water washing was 5 μS/cm, and it was confirmed that removable ionic compounds were sufficiently removed by the washing with water.

The organic phase after the water washing was concentrated under reduced pressure and finally concentrated to dryness at 90° C. for 1 hour to obtain 331 g of the target naphthol aralkyl-based cyanate compound (SNCN) (orange viscous material). The mass average molecular weight Mw of the obtained SNCN was 600. In addition, the IR spectrum of SNCN showed absorption at 2250 cm$^{-1}$ (cyanate groups) and showed no absorption of hydroxy groups. The obtained SNCN was a mixture of compounds in which all $R_1$ in the above formula (5) were hydrogen atoms, and $n_1$ was in the range of 1 to 5.

[Synthesis Example 2] Synthesis of Maleimide Compound (A)

50.5 Parts of maleic anhydride and 125 parts of N-methylpyrrolidone were added to a reaction container equipped with a stirrer, a thermometer, and a condenser, and while the mixture was kept at 10° C. or less, a solution of 15 parts of 1,3-bis(3-aminopropyl)tetramethyldisiloxane (trade name: BY16-871) manufactured by Dow Corning Toray Co., Ltd. dissolved in 100 parts of N-methylpyrrolidone was dropped. After completion of the dropping, the reaction mixture was stirred at room temperature for 6 hours. Then, 11 parts of cobalt naphthenate and 102 parts of acetic anhydride were added to this reaction mixture, and the mixture was reacted at 80° C. for 4 hours.

While the reaction mixture was kept at 5° C. or less, 500 parts of water was added thereto, and the deposited precipitate was filtered off. The obtained solid was further water-washed and then dried to obtain 13 parts of 1,1'-((1,1,3,3-tetramethyldisiloxane-1,3-diyl)bis(propane-3,1-diyl))bis(1H-pyrrole-2,5-dione) of the following formula (13). The yield was 53%. In addition, all R in the above formula (1) were methyl groups, and the proportion of R representing a methyl group, among all R, was 100 mol %.

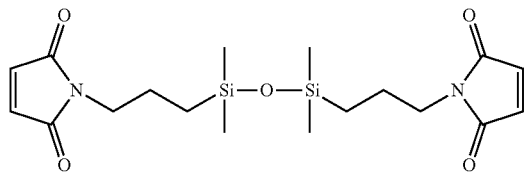

(13)

Example 1

50 Parts by mass of SNCN, 50 parts by mass of 1,1'-((1,1,3,3-tetramethyldisiloxane-1,3-diyl)bis(propane-3,1-diyl))bis(1H-pyrrole-2,5-dione), 100 parts by mass of slurry silica (SC2050MB manufactured by Admatechs Company Limited), 0.5 parts by mass of 2,4,5-triphenylimidazole (manufactured by Tokyo Chemical Industry Co., Ltd.), and 0.11 parts by mass of zinc octylate (manufactured by Nihon Kagaku Sangyo Co., Ltd.) were mixed to obtain a varnish.

Example 2

50 Parts by mass of SNCN, 35 parts by mass of a novolac-based bismaleimide compound (BMI-2300 manufactured by Daiwakasei Industry Co., LTD.), 15 parts by mass of 1,1'-((1,1,3,3-tetramethyldisiloxane-1,3-diyl)bis(propane-3,1-diyl))bis(1H-pyrrole-2,5-dione), 100 parts by mass of slurry silica (SC2050MB manufactured by Admatechs Company Limited), 0.5 parts by mass of 2,4,5-triphenylimidazole (manufactured by Tokyo Chemical Industry Co., Ltd.), and 0.12 parts by mass of zinc octylate (manufactured by Nihon Kagaku Sangyo Co., Ltd.) were mixed to obtain a varnish.

Comparative Example 1

A varnish was obtained as in Example 2 except that 1,1'-((1,1,3,3-tetramethyldisiloxane-1,3-diyl)bis(propane-3,1-diyl))bis(1H-pyrrole-2,5-dione) and 2,4,5-triphenylimidazole were not used, the amount of the novolac-based bismaleimide compound (BMI-2300) used was changed from 35 parts by mass to 50 parts by mass, and further the amount of zinc octylate used was changed from 0.12 parts by mass to 0.15 parts by mass.

[Method for Producing Copper Foil-Clad Laminate]

An E-glass cloth having a thickness of 0.1 mm was impregnated and coated with the obtained varnish, and heated and dried at 165° C. for 4 minutes using a dryer (pressure-resistant explosion-proof steam dryer, manufactured by TAKASUGI MFJ Co. Ltd.)), to obtain a prepreg containing 46% by mass of a resin composition. Eight of these prepregs were stacked, and 12 μm copper foil (3EC-M3-VLP, manufactured by MITSUI MINING & SMELTING CO., LTD.) was disposed on both surfaces. The stack was vacuum-pressed at a pressure of 40 kg/cm$^2$ and a temperature of 220° C. for 80 minutes to obtain a 12 μm copper foil-clad laminate having a thickness of 0.8 mm. The following evaluation was performed using the obtained copper foil-clad laminate.

[(Normal State) Flexural Strength]

The copper foil on both surfaces of the obtained copper foil-clad laminate was removed by etching. Then, the flexural strength modulus was measured with a number of tests of 5 in accordance with JIS C6481 using a test piece (50 mm×25 mm×0.8 mm), and the average value of the maximum values was the measured value (GPa).

[Dielectric Constants (Dk)]

The dielectric constants at 2 GHz and 10 GHz were measured by a cavity resonator perturbation method (Agilent 8722ES, manufactured by Agilent Technologies) using test pieces (n=3) obtained by removing the copper foil of the obtained copper foil-clad laminate, and the average value of three measurements was obtained for each.

[Dielectric Loss Tangents (Df)]

The dielectric loss tangents at 2 GHz and 10 GHz were measured by a cavity resonator perturbation method (Agilent 8722ES, manufactured by Agilent Technologies) using test pieces (n=3) obtained by removing the copper foil of the obtained copper foil-clad laminate, and the average value of three measurements was obtained for each.

[Heat Resistance Evaluation]

The obtained copper foil-clad laminate was cut to a size of 12.7×30 mm by a dicing saw, and then the copper foil on the surfaces was removed by etching, to obtain a measurement sample. The loss modulus E" was measured by a dynamic viscoelasticity analysis apparatus (manufactured by TA Instruments) by a DMA method in accordance with JIS C6481 using this measurement sample, and the heat resistance was evaluated with the value at the peak of E" being Tg (° C.).

[Thermal Expansion Coefficient (TMA)]

The copper foil in the surface layers of the obtained copper foil-clad laminate was removed by etching, and then by a thermo-mechanical analysis apparatus (manufactured by TA Instruments), the temperature was increased by 10° C. per minute from 40° C. to 340° C., and the linear expansion coefficient at 60° C. to 120° C. (ppm/K) was measured.

[Thermal Conductivity]

The copper foil on the surfaces of the obtained copper foil-clad laminate was removed by etching to obtain a measurement sample. The density of this measurement sample was measured, and the specific heat was measured by a DSC (TA Instruments model Q100), and further the thermal diffusivity was measured by a xenon flash analyzer (Bruker: LFA447 Nanoflash). The thermal conductivity (W/m·K) was calculated from the following formula:

thermal conductivity=density (kg/m$^3$)×specific heat (kJ/kg·K)×thermal diffusivity (m$^2$/S)×1000

TABLE 1

| | | Example 1 | Example 2 | Comparative Example 1 |
|---|---|---|---|---|
| (normal state) Flexural strength | GPa | 24.2 | 28.7 | 31.7 |
| Dielectric constants | 2 GHz | 4.32 | 4.41 | 4.60 |
| | 10 GHz | 0.005 | 0.005 | 0.004 |
| Dielectric loss tangents | 2 GHz | 4.18 | 4.23 | 4.40 |
| | 10 GHz | 0.007 | 0.007 | 0.008 |
| Glass transition temperature | ° C. | 271 | 323 | 290 |
| Thermal expansion coefficient | CTE α1 ppm/K | 10.6 | 6.9 | 10.6 |
| Thermal Conductivity | W/m · K | 0.592 | 0.654 | 0.590 |

This application is based on Japanese Patent Application No. 2017-158881 filed on Aug. 21, 2017, the contents of which are incorporated herein by reference.

INDUSTRIAL APPLICABILITY

The resin composition of the present invention has industrial applicability as materials of a prepreg, a metal foil-clad laminate, a resin sheet, a printed wiring board, and the like.

The invention claimed is:

1. A resin composition comprising:
   a maleimide compound (A); and
   a cyanate compound (B),

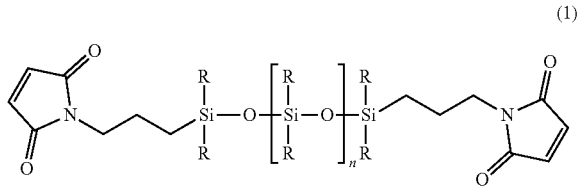
(1)

wherein the maleimide compound (A) comprises 1,1'-((1,1,3,3-tetramethyldisiloxane-1,3-diyl)bis(propane-3,1-diyl))bis(1H-pyrrole-2,5-dione) of the following formula (13):

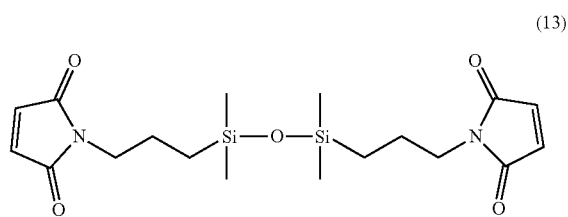 [SMILES: C[Si](C)(CCCN1C(=O)C=CC1=O)O[Si](C)(C)CCCN1C(=O)C=CC1=O]
(13)

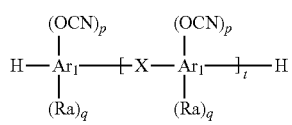
(2)

wherein the cyanate compound (B) comprises a naphthol aralkyl-based cyanate represented by the following formula (5):

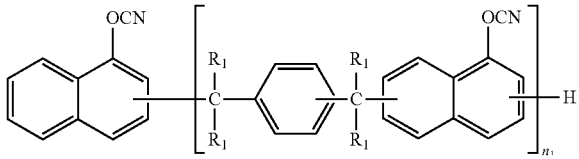
(5)

wherein $R_1$ each independently represents a hydrogen atom or a methyl group, $n_1$ represents an integer of 1 or more.

2. The resin composition according to claim 1, further comprising a compound (C) other than the maleimide compound (A) and the cyanate compound (B).

3. The resin composition according to claim 2, wherein the compound (C) comprises at least one selected from a group consisting of a maleimide compound (C1) other than the maleimide compound (A), a nadimide compound (C2), and an oxazoline compound (C3).

4. The resin composition according to claim 1, wherein a content of the maleimide compound (A) is 1 to 99 parts by mass based on 100 parts by mass of a resin solid in the resin composition.

5. The resin composition according to claim 1, further comprising a filler (D).

6. The resin composition according to claim 5, wherein a content of the filler (D) is 50 to 1600 parts by mass based on 100 parts by mass of a resin solid in the resin composition.

7. A prepreg comprising:
   a base material; and
   the resin composition according to claim 1 with which the base material is impregnated or coated.

8. A metal foil-clad laminate comprising:
   at least one or more layers of the prepreg according to claim 7; and
   a metal foil disposed on one surface or both surfaces of the prepreg.

9. A resin sheet comprising the resin composition according to claim 1.

10. A printed wiring board comprising:
    an insulating layer; and
    a conductor layer formed on a surface of the insulating layer,
    wherein the insulating layer comprises the resin composition according to claim 1.

* * * * *

UNITED STATES PATENT AND TRADEMARK OFFICE
CERTIFICATE OF CORRECTION

PATENT NO. : 11,118,012 B2  
APPLICATION NO. : 16/639936  
DATED : September 14, 2021  
INVENTOR(S) : S. Koga et al.

Page 1 of 1

It is certified that error appears in the above-identified patent and that said Letters Patent is hereby corrected as shown below:

In the Claims

Column 25, Line 15 Claim 1, delete Formula (1)  
Column 25, Line 40 Claim 1, delete Formula (2)

Signed and Sealed this  
Eighth Day of February, 2022

Drew Hirshfeld  
*Performing the Functions and Duties of the*  
*Under Secretary of Commerce for Intellectual Property and*  
*Director of the United States Patent and Trademark Office*